United States Patent
Noumi et al.

(10) Patent No.: US 6,380,813 B1
(45) Date of Patent: Apr. 30, 2002

(54) FREQUENCY-CHARACTERISTIC SWITCHABLE BUFFER CIRCUIT

(75) Inventors: Hiroki Noumi; Toshiki Baba, both of Fukushima-ken (JP)

(73) Assignee: Alps Electric Co., Ltd., Tokyo (JP)

(*) Notice: Subject to any disclaimer, the term of this patent is extended or adjusted under 35 U.S.C. 154(b) by 0 days.

(21) Appl. No.: 09/613,893

(22) Filed: Jul. 11, 2000

(30) Foreign Application Priority Data

Jul. 12, 1999 (JP) ............................................. 11-198004

(51) Int. Cl.[7] .............................................. H03B 27/00
(52) U.S. Cl. ...................... 331/49; 331/179; 331/117 R; 331/74; 331/46
(58) Field of Search ........................... 331/49, 74, 179, 331/46, 117 R; 455/188.1, 191.3, 266

(56) References Cited

U.S. PATENT DOCUMENTS 5,982,240 A * 11/1999 Hayashi ...................... 331/40

FOREIGN PATENT DOCUMENTS

JP        Hei 9-307365        11/1997

* cited by examiner

Primary Examiner—Arnold Kinkead
(74) Attorney, Agent, or Firm—Brinks Hofer Gilson & Lione

(57) ABSTRACT

The frequency-characteristic switchable buffer circuit includes an amplifying stage, a parallel resonance circuit which serves as an output load of the amplifying stage, a frequency trap circuit electrically connected between the input of the amplifying stage and a reference potential point, and a frequency switching voltage generator for selectively generating a first switching voltage or a second switching voltage. The parallel resonance circuit parallel-resonates at a first frequency when the first switching voltage is supplied thereto. When the second switching voltage is supplied thereto, the parallel resonance circuit parallel-resonates at a second frequency. The frequency trap circuit comprises a series circuit made up of a diode and a capacitor. When the first switching voltage is supplied to the frequency trap circuit, the frequency trap circuit series-resonates at a frequency lower than the first frequency. When the second switching voltage is supplied thereto, it series-resonates at any of frequencies lying within a 1700 MHz band, which is higher than the second frequency.

6 Claims, 5 Drawing Sheets

FREQUENCY-CHARACTERISTIC SWITCHABLE BUFFER CIRCUIT

BACKGROUND OF THE INVENTION

1. Field of the Invention

The present invention relates to a frequency-characteristic switchable buffer circuit, and particularly to a frequency-characteristic switchable buffer circuit wherein high frequency selective characteristics are respectively added to signals having selectively-supplied first and second frequencies, whereby selected frequency signal components are outputted in a state in which non-selected frequency signal components are sufficiently attenuated.

2. Description of the Related Art

As mobile communication systems employed in all the countries of the world, there are known a DCS (Digital Cellular System) employed in England, Germany, Italy, France and partial countries in Asia, and a GSM (Global System for Mobile Communications) which is the European unified standard system for a digital portable cellular phone, which has been adopted in 1982, and which is used in partial countries in Europe, America, Africa and Asia.

In this case, the DCS is a mobile communication system wherein 1805 MHz through 1880 MHz, 1710 MHz through 1785 MHz and a 1700 MHz band are respectively assigned to a base-station frequency, a mobile-station frequency, and an oscillating frequency generated from a voltage-controlled oscillator (VCO) of a portable cellular phone, the number of channels to be used is 374, and GMSK (Gaussian Minimum Shift Keying) is used as a modulation scheme. On the other hand, the GSM is a mobile communication system wherein 925 MHz through 960 MHz, 880 MHz through 915 MHz and a 900 MHz band are respectively assigned to a base-station frequency, a mobile-station frequency, and an oscillating frequency generated from a voltage-controlled oscillator (VCO) of a portable cellular phone, the number of channels to be used is 124, and the GMSK (Gaussian Minimum Shift Keying) is used as a modulation scheme.

Since these two mobile communication systems, i.e., the DCS and GSM are originally mobile communication systems different in system from each other, two portable cellular phones: a portable cellular phone used when mobile communications are performed by the DCS and a portable cellular phone used when mobile communications are made by the GSM, are needed to enter the two mobile communication systems of DCS and GSM.

Since, however, the DCS and GSM are both GMSK in use modulation scheme and simply different from each other in assignment use frequency as described above, a portable cellular phone capable of being shared between the DCS and GSM has already been proposed wherein two voltage-controlled oscillators: a first voltage-controlled oscillator for oscillating a first frequency lying within a 1700 MHz band and a second voltage-controlled oscillator for oscillating a second frequency lying within a 900 MHz band, and a switching type oscillator having a switching circuit are placed within the portable cellular phone, and the switching circuit of the switching type oscillator is controlled to thereby allow the proper use of the two voltage-controlled oscillators.

In the portable cellular phone capable of being shared between the DCS and GSM, when the mobile communications are performed by the DCS, the switching circuit is used to bring the first voltage-controlled oscillator to an operating state and bring the second A voltage-controlled oscillator to a non-operating state, whereby an oscillating signal having a first frequency is outputted from the first voltage-controlled oscillator.

On the other hand, when the mobile communications are carried out by the GSM, the switching circuit is used to bring the second voltage-controlled oscillator to an operating state and bring the first voltage-controlled oscillator to a non-operating state, whereby an oscillating signal having a second frequency is outputted from the second voltage-controlled oscillator. Further, the oscillating signal having the first frequency or the oscillating signal having the second frequency is selected and amplified by a buffer circuit capable of performing switching between frequency characteristics, followed by supply to an available circuit.

The frequency-characteristic switchable buffer circuit used at this time has a parallel resonance circuit (frequency selection circuit). When the first voltage-controlled oscillator is kept in the operating state or the second voltage-controlled oscillator is kept in the operating state, the parallel resonance circuit is supplied with a first switching voltage or a second switching voltage to thereby select its characteristic selective characteristic. When the first switching voltage is supplied to the parallel resonance circuit, the parallel resonance circuit selects and outputs the oscillating signal having the first frequency- When the second switching voltage is supplied thereto, the parallel resonance circuit selects and outputs the oscillating signal having the second frequency.

FIG. 5 is a circuit diagram showing one example of a configuration of a conventional frequency-characteristic switchable buffer circuit employed in the portable cellular phone capable of being shared between the DCS and GSM.

As shown in FIG. 5, the conventional frequency-characteristic switchable buffer circuit 50 has an amplifying stage with a transistor 51, base bias resistors 55 and 56, an emitter resistor 57, and a bypass capacitor 58; a parallel resonance circuit (frequency selection circuit) 52; coupling capacitors 53 and 54; a frequency switching voltage generator 71 with a one-circuit two-contacts selector switch 59, switching-voltage setting resistors 60 and 61, and a bypass capacitor 62; a buffer resistor 63; a signal input terminal 64; a signal output terminal 65; and a power terminal 66. These circuit elements are electrically connected to one another as shown in FIG. 5.

Further, the parallel resonance circuit 52 comprises a first inductor $52_1$, a second inductor $52_2$, a first capacitor $52_3$, a second capacitor $52_4$, a third capacitor $52_5$, and a switching diode $52_6$. These circuit elements $52_1$ through $52_6$ are electrically connected to one another as shown in FIG. 5.

As shown in FIG. 5, a first voltage-controlled oscillator 67 for oscillating a first frequency, in this case, each of frequencies lying within a 1700 MHz band, a second voltage-controlled oscillator 68 for oscillating a second frequency, in this case, each of frequencies lying within a 900 MHz band, a power supply or battery 69, and a one-circuit two-contacts selector switch 70 are placed on the preceding stage side of the frequency-characteristic switchable buffer circuit 50. These circuit elements 67 through 70 are electrically connected to one another as shown in FIG. 5. In this case, the selector switch 59 and the selector switch 70 are selected or changed in interlock with each other by a control signal to be described later.

The conventional frequency-characteristic switchable buffer circuit 50 having the above-described configuration is operated as follows:

When the portable cellular phone is used in a mobile communication based on the DCS, movable contacts of the selector switch 59 and the selector switch 70 are respectively changed over from positions indicated by solid lines shown in FIG. 5 to positions indicated by dotted lines illustrated in FIG. 5 according to a first control signal outputted from a controller (not shown). Owing to the changeover, the first voltage-controlled oscillator 67 is electrically connected to the power supply 69 so that it is brought to an operating state. Thus, a signal having a first frequency (corresponding to any of the frequencies lying within the 1700 MHz band) is outputted from the first voltage-controlled oscillator 67. On the other hand, the second voltage-controlled oscillator 68 is electrically disconnected from the power supply 69 so that it is brought to a non-operating state. Owing to the changeover of the movable contact of the selector switch 59 to the position indicated by the dotted line, a first switching voltage corresponding to a positive voltage is supplied to the parallel resonance circuit 52 so that the parallel resonance circuit 52 parallel-resonates at the first frequency (corresponding to any of the frequencies lying within the 1700 MHz band) as will be described below.

When the signal having the first frequency (corresponding to any of the frequencies lying within the 1700 MHz band) outputted from the first voltage-controlled oscillator 67 is supplied to the signal input terminal 64 at this time, only the signal having the first frequency (corresponding to any of the frequencies lying within the 1700 MHz band) is selected and amplified by the parallel resonance circuit 52 which is electrically connected as a load of the transistor 51 and resonates in parallel at the first frequency (corresponding to any of the frequencies lying within the 1700 MHz band), when the signal is amplified by the common emitter-connected transistor 51. Afterwards, the amplified signal having the first frequency (corresponding to any of the frequencies lying within the 1700 MHz band) is supplied to an available circuit through the signal output terminal 65.

On the other hand, when the portable cellular phone is used in a mobile communication based on the GSM, the movable contacts of the selector switch 59 and the selector switch 70 are respectively changed over to the positions indicated by the solid lines shown in FIG. 5 according to a second control signal outputted from the controller in the same manner as described above. Owing to the changeover, the second voltage-controlled oscillator 68 is electrically connected to the power supply 69 so that it is brought to an operating state. Thus, a signal having a second frequency (any of frequencies lying within a 900 MHz band) is outputted from the second voltage-controlled oscillator 68. On the other hand, the first voltage-controlled oscillator 67 is electrically disconnected from the power supply 69 so that it is brought to a non-operating state. Owing to the changeover of the movable contact of the selector switch 59 to the position indicated by the solid line, a second switching voltage corresponding to a ground voltage is supplied to the parallel resonance circuit 52 so that the parallel resonance circuit 52 parallel-resonates at the second frequency (corresponding to any of the frequencies lying within the 900 MHz band) as will be described below.

When the signal having the second frequency (corresponding to any of the frequencies lying within the 900 MHz band) outputted from the second voltage-controlled oscillator 68 is supplied to the signal input terminal 64, only the signal having the second frequency (corresponding to any of the frequencies lying within the 900 MHz band) is selected and amplified by the parallel resonance circuit 52 which is electrically connected as the load of the transistor 51 and resonates in parallel at the second frequency (corresponding to any of the frequencies lying within the 900 MHz band), when the outputted signal is amplified by the common emitter-connected transistor 51. Afterwards, the amplified signal having the second frequency (corresponding to any of the frequencies lying within the 900 MHz band) is supplied to the available circuit through the signal output terminal 65.

Next, a description will be made of operation at the time that a first switching signal or a second switching signal is supplied to the parallel resonance circuit 52 to thereby change the parallel resonance frequency of the parallel resonance circuit 52 to the first frequency or the second frequency.

When the second switching voltage corresponding to the ground voltage is first supplied to the parallel resonance circuit 52 to cause the parallel resonance circuit 52 to parallel-resonate at the signal having the second frequency (corresponding to any of the frequencies lying within the 900 MHz band), the second switching signal voltage corresponding to the ground voltage is supplied to the parallel resonance circuit 52. As a result, the switching diode $52_6$ is turned off so that a point where the second capacitor $52_4$ and the third capacitor $52_5$ are connected to each other, is brought to a state of being separated from a ground point. At this time, a parallel resonance frequency approximately equal to the second frequency (corresponding to any of the frequencies lying within the 900 MHz band) is set to the parallel resonance circuit 52 by a first parallel-connected circuit comprising the first inductor $52_1$ and the first capacitor $52_3$, and a second parallel-connected circuit comprising the second inductor $52_2$ series-connected to the first parallel-connected circuit and the second capacitor $52_4$ and the third capacitor $52_5$. Upon such parallel resonance, the second parallel-connected circuit indicates or takes a small capacitor at the second frequency (corresponding to any of the frequencies lying within the 900 MHz band), and the parallel resonance circuit 52 results in an equivalent circuit comprising a series circuit comprised of the first inductor $52_1$ and the small capacitor, and the first capacitor $52_3$ parallel-connected to the first inductor $52_1$. Thus, the parallel resonance frequency of the parallel resonance circuit 52 can be easily set to the second frequency (corresponding to any of the frequencies lying within the 900 MHz band).

Next, when the first switching signal corresponding to the positive voltage is supplied to the parallel resonance circuit 52 to thereby allow the parallel resonance circuit 52 to parallel-resonate at the signal having the first frequency (corresponding to any of the frequencies lying within the 1700 MHz band), the first switching signal corresponding to the positive voltage is supplied to the parallel resonance circuit 52. As a result, the switching diode $52_6$ is turned on so that the connecting point provided between the second capacitor $52_4$ and the third capacitor $52_5$ is brought to a state of being connected to the ground point. At this time, the side at a point where the second inductor $52_2$ is electrically connected to the first inductor $52_1$, is electrically connected to the ground point through the second capacitor $52_4$ and the turned-on switching diode $52_6$, and the first parallel-connected circuit comprised of the first inductor $52_1$ and the first capacitor $52_3$ can be neglected. Therefore, a parallel resonance frequency approximately equal to the first frequency (corresponding to any of the frequencies lying within the 1700 MHz band) is set to the parallel resonance circuit 52 by the second inductor $52_2$, the second capacitor $52_4$ electrically parallel-connected thereto, and the third capacitor $52_5$. Upon the parallel resonance, the parallel-connected circuit comprising the second capacitor $52_4$ and the third capacitor $52_5$ indicates an integrated capacitor, and the parallel resonance circuit 52 results in an equivalent circuit comprising the second inductor $52_2$ and integrated capacitor connected in parallel. Thus, the parallel resonance frequency of the parallel resonance circuit 52 can be easily set to the first frequency (corresponding to any of the frequencies lying within the 1700 MHz band).

Next, FIG. 6 is a characteristic diagram showing one example of a gain vs. frequency characteristic obtained in the conventional frequency-characteristic switchable buffer circuit 50 shown in FIG. 5.

In FIG. 6, the horizontal axis indicates a frequency (whose unit is represented in GHz), and the vertical axis indicates gain (dB). A curve (indicated by a solid line) a is a characteristic obtained when the buffer circuit 50 parallel-resonates at the first frequency lying in the 1.7 MHz band (1700 MHz band). A curve (indicated by a dotted line) b is a characteristic obtained when the buffer circuit 50 is tuned to the second frequency lying in the 0.9 GHz (900 MHz band).

As indicated by the curves a and b in FIG. 6, when the signal having the first frequency (corresponding to any of the frequencies lying within the 1700 MHz band) is selected as an amplifying signal, the gain of the buffer circuit 50 with respect to the signal having the first frequency increases, whereas when the signal having the second frequency (corresponding to any of the frequencies lying within the 900 MHz band) is selected as an amplifying signal, the gain thereof with respect to the signal having the second frequency increases.

The conventional frequency-characteristic switchable buffer circuit 50 can take out a signal of a first frequency having large signal amplitude because the gain thereof with respect to the signal having the first frequency is large, when the signal having the first frequency (corresponding to any of frequencies lying within a 1700 MHz band) is selected as an amplifying signal. On the other hand, when a signal having the second frequency (corresponding to any of frequencies lying within a 900 MHz band) is selected as an amplifying signal, the frequency-characteristic switchable buffer circuit 50 can take out the signal of the second frequency having large signal amplitude in the same manner as described above since the gain thereof with respect to the second frequency is large.

However, since the conventional frequency-characteristic switchable buffer circuit 50 does not obtain attenuation with respect to a signal on the side of a frequency higher than the first frequency in a large way so much when the signal having the first frequency (corresponding to any of the frequencies lying within the 1700 MHz band) is selected, the rate of the output of a signal having a spurious frequency relative to the first frequency simultaneously with the signal having the first frequency becomes high. Further, since attenuation of harmonic components of the signal having the second frequency is not obtained in a large way so much when the signal having the second frequency (corresponding to any of the frequencies lying within the 900 MHz band) is selected, the rate of the output of a signal having a spurious frequency simultaneously with the signal having the second frequency increases.

SUMMARY OF THE INVENTION

With such a background of art in view, it is therefore an object of the present invention to provide a frequency-characteristic switchable buffer circuit capable of increasing attenuation of a signal having a spurious frequency upon selection of a signal having a first frequency and increasing attenuation of a signal having a spurious frequency upon selection of a signal having a second frequency.

In order to achieve the above object, there is provided a frequency-characteristic switchable buffer circuit according to the present invention, which comprises an amplifying stage, a parallel resonance circuit which serves as an output load of the amplifying stage, a frequency trap circuit connected between an input of the amplifying stage and a reference potential point, and a frequency switching voltage generator for selectively generating a first switching voltage or a second switching voltage, and wherein the parallel resonance circuit parallel-resonates at a first frequency when the first switching voltage is supplied thereto and parallel-resonates at a second frequency different from the first frequency when the second switching voltage is supplied thereto, and the frequency trap circuit comprises a series circuit comprised of a diode and a capacitor, and series-resonates at the second frequency when the first switching voltage is supplied thereto and series-resonates at the first frequency when the second switching voltage is supplied thereto.

As one preferred example having the above configuration, there is also provided a frequency-characteristic switchable buffer circuit wherein a first frequency is supplied from a first oscillator, a second frequency is supplied from a second oscillator and the first oscillator and second oscillator are alternately changed to an operating or non-operating state, and when the first oscillator is in the operating state, a frequency switching voltage generator is switched so as to output a first switching voltage and when the second oscillator is in the operating state, the frequency switching voltage generator is switched so as to output a second switching voltage.

As another preferred example having the above configuration, there is further provided a frequency-characteristic switchable buffer circuit wherein a second frequency and a first frequency have a relationship between a fundamental wave frequency and a harmonic frequency thereof, the second frequency is directly supplied from an oscillator and the first frequency is supplied from a harmonic generator to which the second frequency is applied, and when the first frequency is supplied from the oscillator, a frequency switching voltage generator is changed so as to output a first switching voltage and when the second frequency is supplied from the harmonic generator, the frequency switching voltage generator is changed so as to output a second switching voltage.

According to the above configuration, when a first switching voltage is supplied to a parallel resonance circuit to allow the parallel resonance circuit to parallel-resonate at a first frequency, thereby selecting and outputting a signal having the first frequency, the first switching voltage is supplied even to a frequency trap circuit to thereby cause the frequency trap circuit to series-resonate at a frequency lower than the first frequency. As a result, a trap is developed on the side of a frequency higher than the first frequency by its bound or bounce. The developed trap serves so as to attenuate signal components of a spurious frequency of the signal having the first frequency. On the other hand, when a second switching voltage is supplied to the parallel resonance circuit to cause the parallel resonance circuit to parallel-resonate at a second frequency, thereby selecting and outputting a signal having the second frequency, the second switching voltage is supplied even to the frequency trap circuit to thereby allow the frequency trap circuit to series-resonate at a frequency in the neighborhood of 1700 MHz, thereby serving so as to attenuate signal components of a spurious frequency of the second frequency. Thus, when the signal having the first frequency is selected, attenuation of signal components of a spurious frequency in the signal having the first frequency can be increased. Further, when the signal having the second frequency is selected, attenuation of a signal having a spurious frequency included in the signal having the second frequency can be increased, whereby the signal having the first frequency or the signal having the second frequency can be selected and outputted in a state in which the spurious signal components are little included therein.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Preferred embodiments of the present invention will hereinafter be described with reference to the accompanying drawings.

Figure 1:
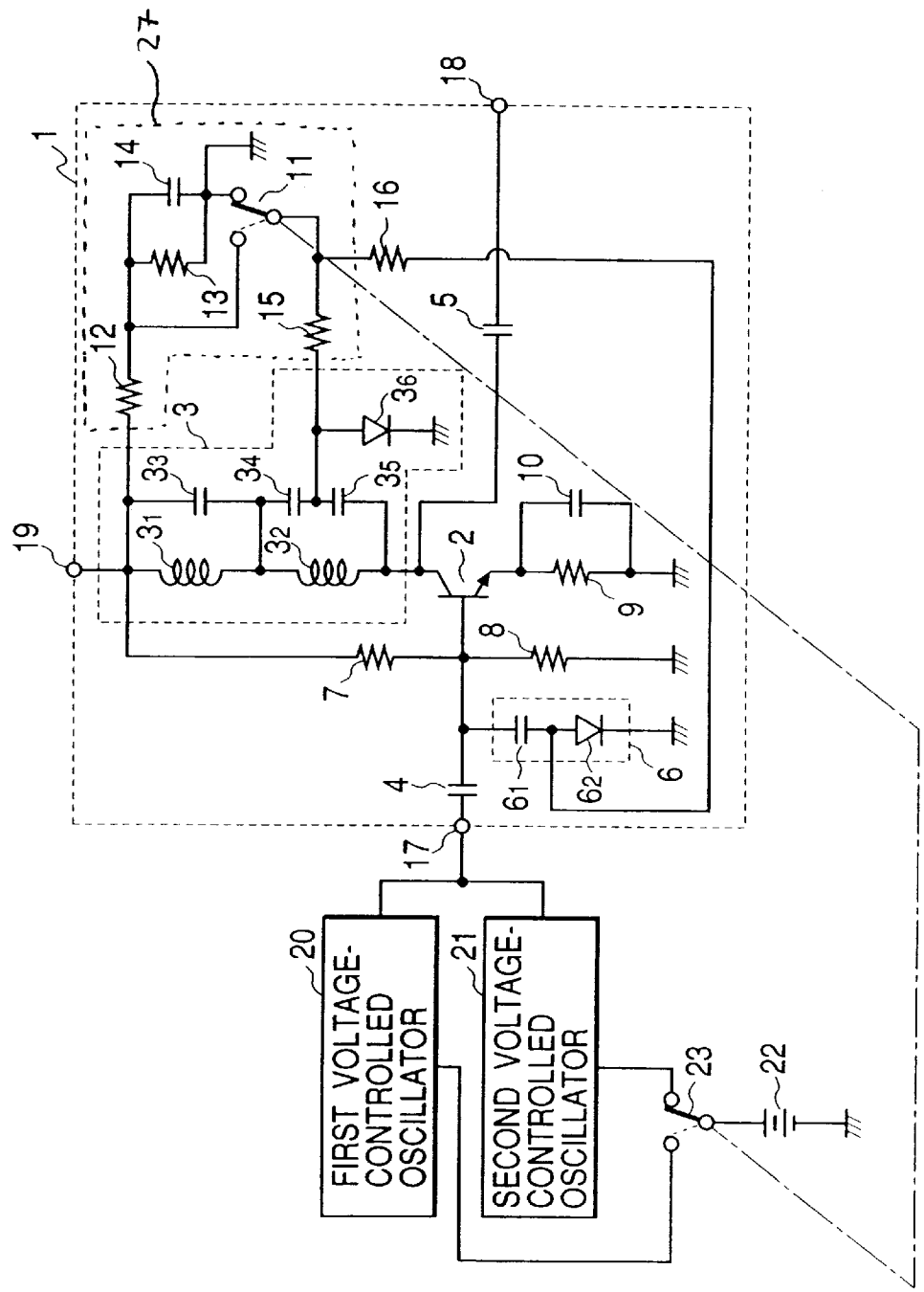
FIG. 1 is a circuit configurational diagram showing a first embodiment of a frequency-characteristic switchable buffer circuit according to the present invention.

FIG. 1 is a circuit configurational diagram showing a first embodiment of a frequency-characteristic switchable buffer circuit according to the present invention and shows an example in which the present buffer circuit is used in a portable cellular phone which can be shared between the DCS and GSM.

As shown in FIG. 1, the frequency-characteristic switchable buffer circuit 1 according to the first embodiment includes an amplifying stage having a transistor 2, base bias resistors 7 and 8, an emitter resistor 9, and a bypass capacitor 10; a parallel resonance circuit (frequency selection circuit) 3; coupling capacitors 4 and 5; a frequency trap circuit 6; a frequency switching voltage generator 27 with a one-circuit two-contacts selector switch 11, switching-voltage setting resistors 12 and 13, and a bypass capacitor 14; buffer resistors 15 and 16; a signal input terminal 17; a signal output terminal 18; and a power terminal 19. These circuit elements are electrically connected to one another as shown in FIG. 1.

Further, the parallel resonance circuit 3 includes a first inductor $3_1$, a second inductor $3_2$, a first capacitor $3_3$, a second capacitor $3_4$, a third capacitor $3_5$, and a first switching diode $3_6$. On the other hand, the frequency trap circuit 6 has a sixth capacitor $6_1$, and a second switching diode $6_2$. These circuit elements $3_1$ through $3_6$ and $6_1$ and $6_2$ are electrically connected to one another as shown in FIG. 1.

In the parallel resonance circuit 3 in this case, the inductance of the first inductor $3_1$ is selected so as to be larger than that of the second inductor $3_2$, and the capacitance of the third capacitor $3_5$ is selected so as to be much larger than that of the second capacitor $3_4$. For example, when the capacitance of the third capacitor $3_5$ is 1000 pF, the capacitance of the second capacitor $3_4$ is selected so as to take or assume about 2 pF.

As shown in FIG. 1, a first voltage-controlled oscillator 20 for oscillating a first frequency, in this case, frequencies lying within a 1700 MHz band, a second voltage-controlled oscillator 21 for oscillating a second frequency, in this case, frequencies lying within a 900 MHz band, a power supply or battery 22, and a one-circuit two-contacts selector switch 23 are placed on the preceding stage side of the frequency-characteristic switchable buffer circuit 1. These circuit elements 20 through 23 are electrically connected to one another as shown in FIG. 1. In this case, the selector switch 11 and the selector switch 23 are selected or changed in interlock with a control signal to be described later.

Figure 5:
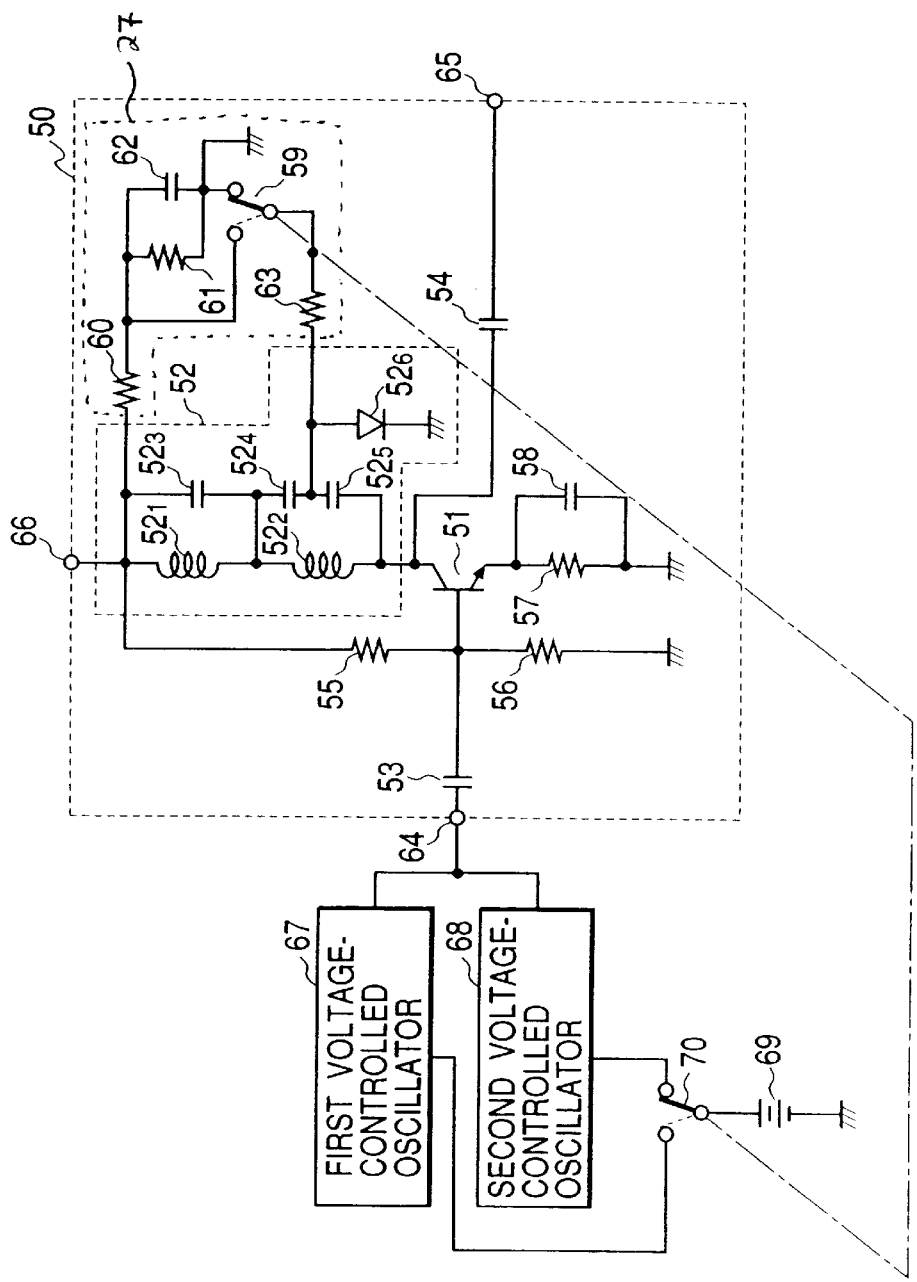
FIG. 5 is a circuit configurational diagram showing one example of a conventional frequency-characteristic switchable buffer circuit.

Meanwhile, the frequency-characteristic switchable buffer circuit 1 (hereinafter called "buffer circuit 1 according to the present embodiment") and the conventional frequency-characteristic switchable buffer circuit 50 (hereinafter called "conventional buffer circuit 50") shown in FIG. 5 are different in configuration from each other only in that the buffer circuit 1 according to the present embodiment is equipped with the frequency trap circuit 6, and a first switching voltage or a second switching voltage is selectively supplied to the second switching diode $6_2$ of the frequency trap circuit 6 in association with the provision of the frequency trap circuit 6, whereas the conventional buffer circuit 50 is not equipped with such a frequency trap circuit 6 There is no difference between the buffer circuit 1 according to the present embodiment and the conventional buffer circuit 50 in other configurations.

Since the parallel resonance circuit 3 employed in the buffer circuit 1 according to the present embodiment is identical in configuration to the parallel resonance circuit 52 employed in the conventional buffer circuit 50, the operation of the buffer circuit 1 according to the present embodiment at the time that either the first switching voltage or the second switching voltage is supplied to the parallel resonance circuit 3 thereof, is identical to that of the already-described conventional buffer circuit 50 at the time that either the first switching voltage or the second switching voltage is supplied to the parallel resonance circuit 52 thereof.

Therefore, the operation of the conventional buffer circuit 50 at the time that the first switching voltage or the second switching voltage is supplied to the parallel resonance circuit 52 thereof, is quoted for the following description of the operation of the buffer circuit 1 according to the present embodiment. Thus, a description made of the operation of the buffer circuit 1 according to the present embodiment at the time that the first switching voltage or the second switching voltage is supplied to the parallel resonance circuit 3 thereof, will be omitted.

The frequency-characteristic switchable buffer circuit according to the first embodiment, having the above-described configuration is operated as follows:

When the portable cellular phone is used in a mobile communication based on the DCS, movable contacts of the selector switch 11 and the selector switch 23 are respectively changed over from positions indicated by solid lines shown in FIG. 1 to positions indicated by dotted lines illustrated in FIG. 1 according to a first control signal outputted from a controller (not shown). Owing to the changeover of the movable contact of the selector switch 23 to the position indicated by the dotted line, the first voltage-controlled oscillator 20 is electrically connected to the power supply 22 so that Ad it is brought to an operating state Thus, a signal having a first frequency (corresponding to any of frequencies lying within the 1700 MHz band) is outputted from the first voltage-controlled oscillator 20. On the other hand, the second voltage-controlled oscillator 21 is electrically disconnected from the power supply 22 so that it is brought to a non-operating state. Owing to the changeover of the movable contact of the selector switch 11 to the position indicated by the dotted line, a first switching voltage corresponding to a positive voltage is supplied to the parallel resonance circuit 3 so that the parallel resonance circuit 3 parallel-resonates at the first frequency (corresponding to any of frequencies lying within the 1700 MHz band) as already described above. Simultaneously with this, the first switching voltage corresponding to the positive voltage is supplied to the frequency trap circuit 6 so that the frequency trap circuit 6 series-resonates at a second frequency (corresponding to any of frequencies lying within the 900 MHz band) as will be described below.

When the signal having the first frequency (corresponding to any of the frequencies lying within the 1700 MHz band) outputted from the first voltage-controlled oscillator 20 is supplied to the signal input terminal 17, only the signal having the first frequency (corresponding to any of the frequencies lying within the 1700 MHz band) is selected and amplified by the parallel resonance circuit 3 which is electrically connected as a collector load of the transistor 2 and resonates in parallel at the first frequency (corresponding to any of the frequencies lying within the 1700 MHz band), when the signal is amplified by the common emitter-connected transistor 2. Afterwards, the amplified signal having the first frequency (corresponding to any of the frequencies lying within the 1700 MHz band) is supplied to an available circuit through the signal output terminal 18. At this time, the frequency trap circuit 6, which resonates in series at a frequency lower than the first frequency, is electrically connected between the base of the transistor 2 and the ground. When the frequency trap circuit 6 is caused to resonate in series at the low frequency, a bounce or bound trap thereof occurs on the higher frequency side of the first frequency and thereby signal components of a spurious frequency contained in the signal having the first frequency are sufficiently attenuated by the trap. It is therefore possible to supply only the signal having the first frequency, which does not include the signal components of the spurious frequency, to the signal output terminal 18.

On the other hand, when the portable cellular phone is used in a mobile communication based on the GSM, the movable contacts of the selector switch 11 and the selector switch 23 are respectively changed over to the positions indicated by the solid lines shown in FIG. 1 according to a second control signal outputted from the controller in the same manner as described above. Owing to the changeover of the movable contact of the selector switch 23 to the position indicated by the solid line, the second voltage-controlled oscillator 21 is electrically connected to the power supply 22 so that it is brought to an operating state.

Thus, a signal having a second frequency (any of frequencies lying within a 900 MHz band) is outputted from the second voltage-controlled oscillator 21. On the other hand, the first voltage-controlled oscillator 20 is electrically disconnected from the power supply 22 so that it is brought to a non-operating state. Owing to the changeover of the movable contact of the selector switch 11 to the position indicated by the solid line, a second switching voltage corresponding to a ground voltage is supplied to the parallel resonance circuit 3 so that the parallel resonance circuit 3 parallel-resonates at the second frequency (corresponding to any of the frequencies lying within the 900 MHz band) as already described above. Simultaneously with this, the second switching voltage corresponding to the ground voltage is supplied to the frequency trap circuit 6 so that the frequency trap circuit 6 series-resonates at each frequency lying within the 1700 MHz band as will be described below.

When the signal having the second frequency (corresponding to any-of the frequencies lying within the 900 MHz band) outputted from the second voltage-controlled oscillator 21 is supplied to the signal input terminal 17, only the signal having the second frequency (corresponding to any of the frequencies lying within the 900 MHz band) is selected and amplified by the parallel resonance circuit 3 which is electrically connected as the collector load of the transistor 2 and resonates in parallel at the second frequency (corresponding to any of the frequencies lying within the 900 MHz band), when the outputted signal is amplified by the common emitter-connected transistor 2. Afterwards, the amplified signal having the second frequency (corresponding to any of the frequencies lying within the 900 MHz band) is supplied to the available circuit through the signal output terminal 18. At this time, the frequency trap circuit 6, which resonates in series at each frequency lying within the 1700 MHz band, is electrically connected between the base of the transistor 2 and the ground, and hence spurious signal components contained in the signal having the second frequency are sufficiently attenuated by the frequency trap circuit 6. It is therefore possible to supply only the signal having the second frequency, which does not include the spurious signal components, to the signal output terminal 18.

Figure 2A:
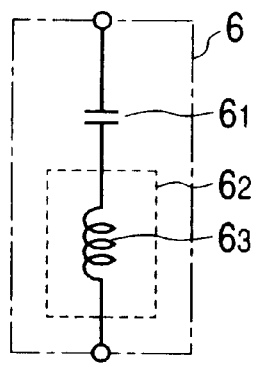
FIGS. 2A and 2B are equivalent circuit diagrams of a frequency trap circuit shown in FIG. 1 to which a first switching signal or a second switching signal is supplied.
Figure 2B:
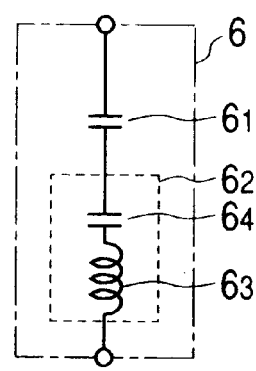

Now, FIGS. 2A and 2B are respectively equivalent circuit diagrams of the frequency trap circuit 6 shown in FIG. 1 to which either a first switching signal or a second switching signal is supplied.

A description will be made of the operation of each of the frequency trap circuits 6 each employed in the buffer circuit 1, wherein their series resonance frequencies are respectively changed to a second frequency or a first frequency according to the supply of the first switching signal or the second switching signal thereto while the equivalent circuit diagrams shown in FIGS. 2A and 2B are being used jointly.

When a first switching voltage corresponding to a positive voltage is supplied to a frequency trap circuit 6, a second switching diode $6_2$ is first turned on so that only a lead inductor 63 of a lead thereof, which is constituted as the second switching diode $6_2$, remains as a circuit element and is electrically series-connected to a fourth capacitor $6_1$. At this time, the frequency trap circuit 6 results in a series circuit comprising the fourth capacitor $6_1$ and the lead inductor $6_3$ as shown in FIG. 2A. When the capacitance value of the fourth capacitor $6_1$ and the inductance value of the lead inductor $6_3$ are respectively selected to thereby allow the series circuit to resonate in series at a frequency lower than the first frequency, a trap is produced on the side of a frequency higher than the first frequency due to its bounding or bounce. The produced trap greatly attenuates spurious high-frequency signal components of the first frequency.

Next, when a second switching voltage corresponding to a ground voltage is supplied to the frequency trap circuit 6, the second switching diode $6_2$ is turned off so that a series circuit comprising a lead inductor $6_3$ of a lead thereof and a junction capacitance $6_4$ of a semiconductor junction thereof, which are constituted as the second switching diode $6_2$, remains as a circuit element and is electrically series-connected to a fourth capacitor $6_1$. At this time, the frequency trap circuit 6 results in a series circuit comprising the fourth capacitor $6_1$, the lead inductor $6_3$ and the junction capacitance $6_4$ as shown in FIG. 2B. The capacitance value of the fourth capacitor $6_1$, the inductance value of the lead inductor $6_3$ and the capacitance value of the junction capacitance $6_4$ are respectively selected to thereby allow the series circuit to resonate in series at each frequency lying within the 1700 MHz band, whereby spurious high-frequency signal components of the second frequency can be greatly attenuated.

Figure 3:
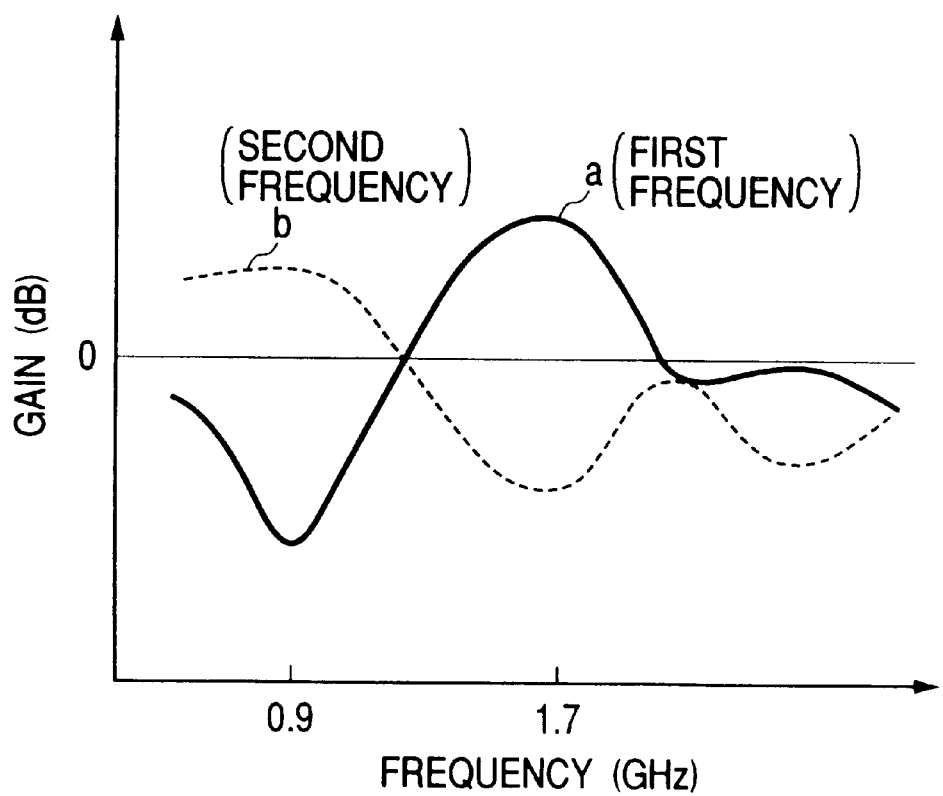
FIG. 3 is a characteristic diagram illustrating a gain vs. frequency characteristic obtained by the frequency-response switchable buffer circuit shown in FIG. 1.

Next, FIG. 3 is a characteristic diagram showing a gain vs. frequency characteristic obtained in the frequency-characteristic switchable buffer circuit 1 according to the present embodiment shown in FIG. 1.

In FIG. 3, the horizontal axis indicates a frequency (whose unit is represented in GHz), and the vertical axis indicates gain (dB). A curve (indicated by a solid line) a is a characteristic obtained when the buffer circuit 1 parallel-resonates at the first frequency lying in the 1.7 MHz band (1700 MHz band) and the bounce or bound trap is developed on the side of the frequency higher than the first frequency by the frequency trap circuit 6. A curve (indicated by a dotted line) b is a characteristic obtained when the buffer circuit 1 resonates in parallel at the second frequency lying in the 0.9 GHz band (900 MHz band) and the frequency trap circuit 6 resonates in series at the 1.7 MHz band (1700 MHz band).

Figure 6:
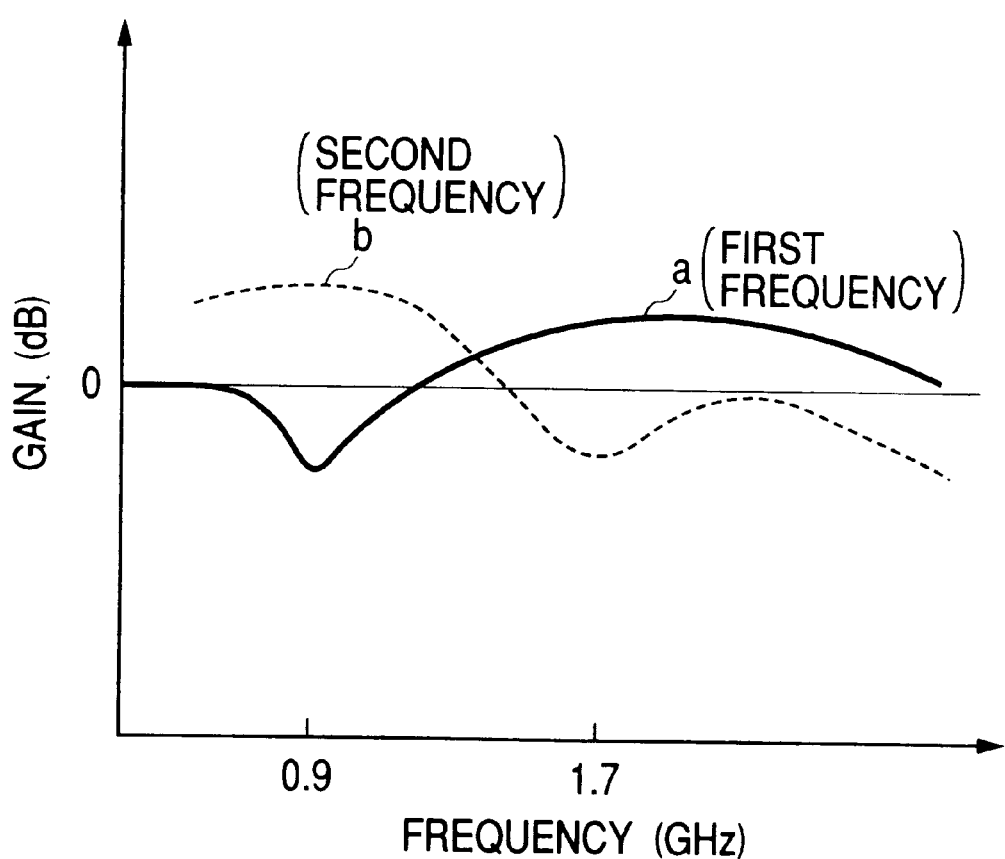
FIG. 6 is a characteristic diagram illustrating a gain vs. frequency characteristic obtained by the frequency-characteristic switchable buffer circuit shown in FIG. 5.

A comparison is made between the characteristic obtained by the frequency-characteristic switchable buffer circuit 1 according to the first embodiment and the characteristic obtained by the conventional frequency-characteristic switchable buffer circuit 50 shown in FIG. 6. As a result, when the signal having the first frequency (corresponding to any of frequencies lying within the 1700 MHz band) is selected, the gain of the buffer circuit 1 with respect to the first frequency increases and attenuation of a spurious signal on the side of the frequency higher than the first frequency also increases greatly, as shown in the curves a and b of FIG. 3. On the other hand, when the signal having the second frequency (corresponding to any of frequencies lying within the 900 MHz band) is selected, attenuation of the signal having the frequency lying within the 1700 MHz band, which corresponds to a signal having a frequency spurious with respect to the second frequency, greatly increases although the gain relative to the signal having the second frequency does not increase or decrease.

Thus, the frequency-characteristic switchable buffer circuit I according to the first embodiment can not only greatly increase the attenuation of signal components of the spurious frequency of the first frequency when the signal having the first frequency (corresponding to any of the frequencies lying within the 1700 MHz band) is selected, but also greatly increase the attenuation of signal components of the frequency lying within the 1700 MHz band even when the signal having the second frequency (corresponding to any of the frequencies lying within the 900 MHz band) is selected, thus making it possible to select and output the signal having the second frequency in a state in which the spurious signal components are little included therein.

Incidentally, the first embodiment has been described by the example in which the frequency-characteristic switchable buffer circuit 1 is used in the portable cellular phone capable of being shared between the DCS and GSM, and the frequency of the oscillating signal outputted from the first voltage-controlled oscillator 20 is any of the frequencies lying within the 1700 MHz band and the frequency of the oscillating signal outputted from the second voltage-controlled oscillator 21 is any of the frequencies lying within the 900 MHz band. However, the frequency-characteristic switchable buffer circuit 1 according to the present invention is not limited to the case in which it is used in the above-described portable cellular phone. It may be used in other similar apparatuses. In relation to it, the respective oscillating frequencies of the first voltage-controlled oscillator 20 and the second voltage-controlled oscillator 21 are not limited to those lying within the aforementioned frequency bands. If ones whose oscillating frequency bands are appropriately separated from each other, are adopted, then other frequency bands may be used.

While the first embodiment has been described by the example in which the two first and second oscillators are both the voltage-controlled oscillators 20 and 21, the two oscillators according to the present invention are not necessarily limited to the voltage-controlled oscillators. An oscillator circuit for generating oscillating signals lying within a fixed frequency band may be used.

Figure 4:
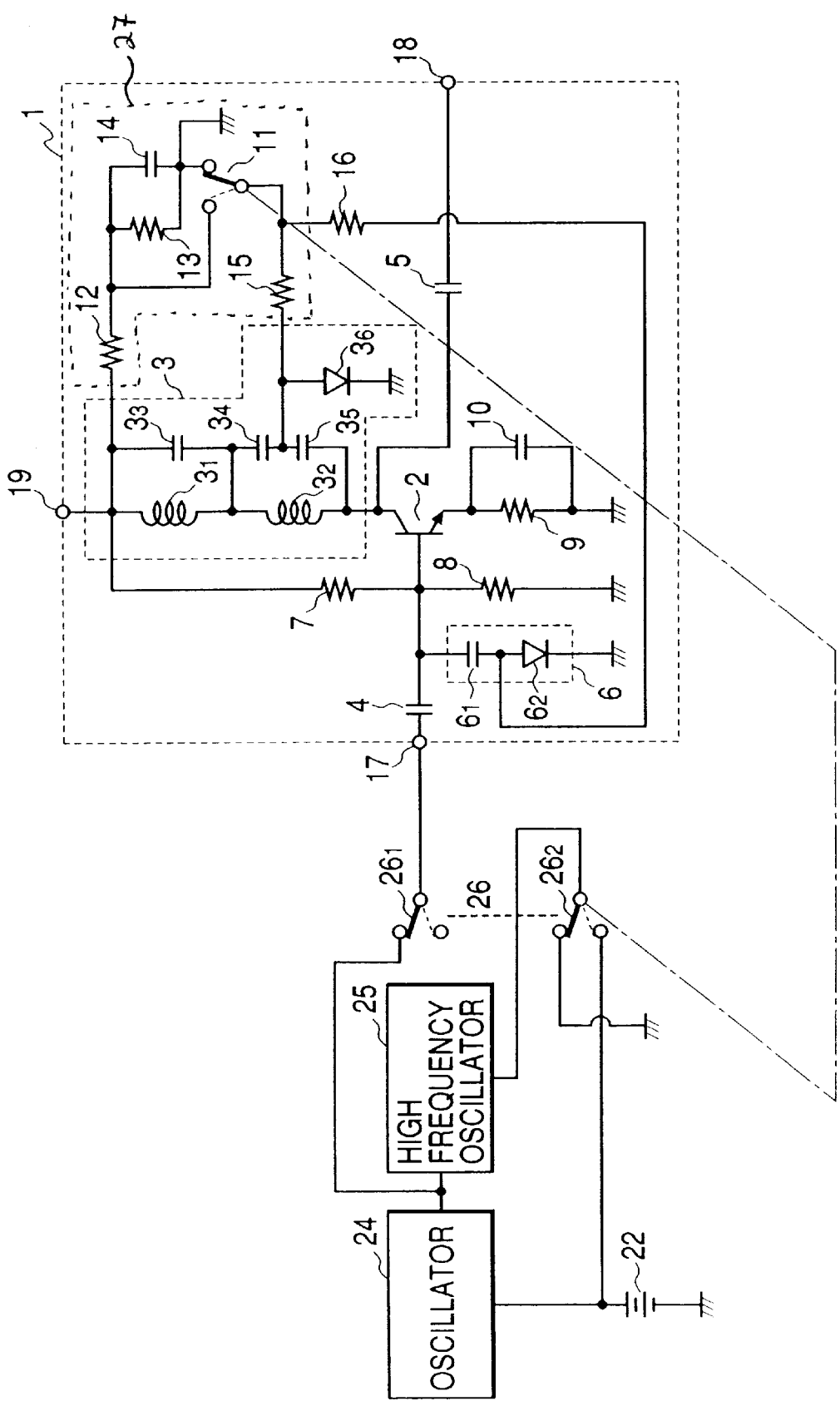
FIG. 4 is a circuit configurational diagram depicting a second embodiment of a frequency-characteristic switchable buffer circuit according to the present invention.

Next, FIG. 4 is a circuit configurational diagram showing a second embodiment of a frequency-characteristic switchable buffer circuit according to the present invention and illustrates a configurational example in which a second frequency and a first frequency satisfy a fundamental wave frequency and a secondary harmonic frequency thereof.

As shown in FIG. 4, the frequency-characteristic switchable buffer circuit 1 according to the second embodiment is identical in configuration to the frequency-characteristic switchable buffer circuit 1 according to the first embodiment. However, a configuration on the preceding side of the frequency-characteristic switchable buffer circuit 1 according to the second embodiment includes a single voltage-controlled oscillator 24, a second harmonic generator 25, an interlock selector switch 26 comprising two pairs of one-circuit two-contacts selector switches $26_1$ and $26_2$, and a power supply or battery 22. The present configuration is different from the configuration on the preceding side of the frequency-characteristic switchable buffer circuit 1 according to the first embodiment, which is provided with the first voltage-controlled oscillator 20 and the second voltage-controlled oscillator 21.

In the frequency-characteristic switchable buffer circuit 1 according to the second embodiment, when a selector switch 11 and the interlock selector switch 26 are changed in interlock with each other according to a first control signal or second control signal supplied from a controller (not shown) to thereby switch respective movable contacts of the interlock selector switch 26 to the sides indicated by solid lines respectively, the power supply 22 is electrically disconnected from the second harmonic generator 25 by the selector switch $26_2$. Therefore, the power supply 22 is electrically connected to the voltage-controlled oscillator 24 alone, so that the fundamental wave frequency, e.g., an oscillating signal having a second frequency lying within a 900 MHz band is outputted from the voltage-controlled oscillator 24. The oscillating signal is supplied to a signal input terminal 17 of the frequency-characteristic switchable buffer circuit 1 through the selector switch 26₁. On the other hand, when the respective movable contacts of the interlock selector switch 26 are switched to the sides indicated by dotted lines respectively, the power supply 22 is electrically connected even to the second harmonic generator 25 by the selector switch 26₂, so that the second harmonic generator 25 is brought to an operating state. At this time, the second harmonic generator 25 outputs a secondary harmonic of the fundamental wave frequency supplied from the voltage-controlled oscillator 24, e.g., an oscillating signal having a first frequency lying within a 1700 MHz band in response to the fundamental wave frequency, e.g., the oscillating signal having the second frequency lying within the 900 MHz band. The oscillating signal is supplied to the signal input terminal 17 of the frequency-characteristic switchable buffer circuit 1 through the selector switch 26₁.

In this case, the operation of the frequency-characteristic switchable buffer circuit 1 according to the second embodiment at the time that the oscillating signal having the second frequency lying within the 900 MHz band is supplied to the signal input terminal 17, is the same as that of the frequency-characteristic switchable buffer 1 according to the first embodiment at the time that the oscillating signal having the second frequency lying within the 900 MHz band is supplied to the signal input terminal 17.

Thus, the frequency-characteristic switchable buffer circuit 1 according to the second embodiment can also not only greatly increase attenuation of signal components of a spurious frequency with respect to the first frequency when the signal having the first frequency (corresponding to any of frequencies lying within the 1700 MHz band) is selected, but also greatly increase attenuation of signal components of any of frequencies lying within the 1700 MHz band, which is a spurious frequency of the signal having the second frequency even when the signal having the second frequency (corresponding to any of frequencies lying within the 900 MHz band) is selected, thus making it possible to select and output the signal having the first frequency or the signal having the second frequency in a state in which the spurious signal components are little included therein.

Incidentally, while the second embodiment has been described by the example in which the single oscillator is the voltage-controlled oscillator 24, the single oscillator employed in the present invention is not limited to the voltage-controlled oscillator. It may be a single oscillator which generates each of oscillating signals in a fixed frequency band.

According to the present invention as described above, when a first switching voltage is supplied to a parallel resonance circuit to allow the parallel resonance circuit to parallel-resonate at a first frequency, thereby selecting and outputting a signal having the first frequency, the first switching voltage is supplied even to a frequency trap circuit to thereby cause the frequency trap circuit to series-resonate at a frequency lower than the first frequency. As a result, a trap is developed on the side of a frequency higher than the first frequency by its bound or bounce. The developed trap attenuates signal components of a spurious frequency higher than the first frequency. On the other hand, when a second switching voltage is supplied to the parallel resonance circuit to cause the parallel resonance circuit to parallel-resonate at a second frequency, thereby selecting and outputting a signal having the second frequency, the second switching voltage is supplied even to the frequency trap circuit to thereby allow the frequency trap circuit to series-resonate at any of frequencies lying within a 1700 MHz band, whereby signal components of any of the frequencies lying within the 1700 MHz band, which is a spurious frequency with respect to the second frequency, are attenuated. Therefore, when the signal having the second frequency is selected, attenuation of the spurious signal components thereof can be increased. From the above result, an effect is brought about in that the signal having the first frequency or the signal having the second frequency can be selected and outputted in a state in which it little includes the spurious signal components.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A frequency-characteristic switchable buffer circuit, comprising:
   an amplifying stage;
   a parallel resonance circuit which serves as an output load of the amplifying stage;
   a frequency trap circuit connected between an input of the amplifying stage and a reference potential point; and
   a frequency switching voltage generator to selectively generate one of a first switching voltage and a second switching voltage; and
   wherein the parallel resonance circuit parallel-resonates at a first frequency when the first switching voltage is supplied thereto and parallel-resonates at a second frequency different from the first frequency when the second switching voltage is supplied thereto, and
   the frequency trap circuit comprises a series circuit comprised of a diode and a capacitor, and series-resonates at the second frequency when the first switching voltage is supplied thereto and series-resonates at the first frequency when the second switching voltage is supplied thereto.

2. The frequency-characteristic switchable buffer circuit as claimed in claim 1, wherein the first frequency is supplied from a first oscillator, the second frequency is supplied from a second oscillator and the first oscillator and second oscillator are alternately changed between an operating and non-operating state, and when the first oscillator is in the operating state, the frequency switching voltage generator is switched to output the first switching voltage and when the second oscillator is in the operating state, the frequency switching voltage generator is switched to output the second switching voltage.

3. The frequency-characteristic switchable buffer circuit as claimed in claim 2, wherein the first oscillator and the second oscillator are respectively voltage-controlled oscillators.

4. The frequency-characteristic switchable buffer circuit as claimed in claim 3, wherein the first oscillator outputs an oscillating signal having a first frequency lying within a 1700 MHz band employed in a DCS mobile communication, and the second oscillator outputs an oscillating signal having a second frequency lying within a 900 MHz band employed in a GSM mobile communication.

5. The frequency-characteristic switchable buffer circuit as claimed in claim 1, wherein the second frequency and the first frequency have a relationship between a fundamental wave frequency and a harmonic frequency thereof, the second frequency is directly supplied from an oscillator and the first frequency is supplied from a harmonic generator to which the second frequency is applied, and when the first frequency is supplied from the oscillator, the frequency switching voltage generator is changed so as to output the first switching voltage and when the second frequency is supplied from the harmonic generator, the frequency switching voltage generator is changed so as to output the second switching voltage.

6. The frequency-characteristic switchable buffer circuit as claimed in claim 5, wherein the oscillator is a voltage-controlled oscillator.

* * * * *